US012720852B2

(12) United States Patent
Coyne

(10) Patent No.: US 12,720,852 B2
(45) Date of Patent: Aug. 25, 2026

(54) SEMICONDUCTOR DEVICES TO DETECT ONE OR MORE ENVIRONMENTAL CONDITIONS

(71) Applicant: Analog Devices International Unlimited Company, Limerick (IE)

(72) Inventor: Edward Coyne, Athenry (IE)

(73) Assignee: Analog Devices International Unlimited Company, Limerick (IE)

(*) Notice: Subject to any disclaimer, the term of this patent is extended or adjusted under 35 U.S.C. 154(b) by 497 days.

(21) Appl. No.: 18/472,982

(22) Filed: Sep. 22, 2023

(65) Prior Publication Data

US 2025/0107217 A1 Mar. 27, 2025

(51) Int. Cl.

*H01L 31/0525* (2014.01)
*G01K 7/01* (2006.01)
*H02S 40/44* (2014.01)
*H10D 84/82* (2025.01)

(52) U.S. Cl.

CPC ............... *H10D 84/82* (2025.01); *G01K 7/01* (2013.01)

(58) Field of Classification Search

CPC .... H10D 84/82; H10D 30/472; H10D 62/822; H10D 30/43; H10D 30/015; H10D 84/038; H10D 30/025; H10D 62/83; H10D 84/0177; H10D 30/022; H10D 30/6713; H10D 30/6735; H10D 64/259; H10D 84/85; H10D 30/402; H10D 62/121; H10D 30/031; H10D 30/0316; H10D 30/0321; H10D 30/67; H10D 30/6729; H10D 30/6732; H10D 30/6734; H10D 30/831; H10D 48/30; H10D 62/151; H10D 64/311; H10D 64/512; H10D 64/518; H10D 64/519; H10D 30/6728; H10D 86/60; H10D 86/411; H10D 30/797

See application file for complete search history.

(56) References Cited

U.S. PATENT DOCUMENTS

| | | | |
|---|---|---|---|
| 4,636,827 A | 1/1987 | Rudolf | |
| 12,320,775 B2 * | 6/2025 | Huang | B01L 3/502761 |
| 2007/0247170 A1 | 10/2007 | Barbaro et al. | |
| 2013/0143221 A1 * | 6/2013 | Beauchemin | G01N 27/416 435/6.12 |
| 2017/0016851 A1 * | 1/2017 | Cheng | G01N 27/4148 |
| 2019/0033252 A1 * | 1/2019 | Huang | B01L 3/502715 |
| 2020/0271620 A1 | 8/2020 | Cheng et al. | |
| 2021/0270770 A1 | 9/2021 | Zhang et al. | |

FOREIGN PATENT DOCUMENTS

JP 2010243299 A 10/2010

OTHER PUBLICATIONS

"European Application Serial No. 24200643.5, Extended European Search Report mailed Feb. 17, 2025", 7 pgs.

* cited by examiner

*Primary Examiner* — Niki H Nguyen

(74) *Attorney, Agent, or Firm* — Schwegman Lundberg & Woessner, P.A.

(57) ABSTRACT

Semiconductor devices can include a reservoir of ions and one or more channel regions. Additionally, the semiconductor devices can include one or more diffusion control devices that control the flow of ions from the reservoir to the one or more channel regions. The presence of ions in the one or more channel regions can be detected and used to determine that the semiconductor devices have been subjected to one or more events.

20 Claims, 7 Drawing Sheets

SEMICONDUCTOR DEVICES TO DETECT ONE OR MORE ENVIRONMENTAL CONDITIONS

FIELD OF THE DISCLOSURE

This document pertains generally, but not by way of limitation, to apparatuses and methods related to detection of an occurrence of a condition using semiconductor devices.

BACKGROUND

Sensors can be used to detect that a given condition has occurred within an environment. The environment can include an ambient environment, one or more pieces of machinery, one or more computing devices, one or more vehicles, or an organic environment, such as a human or other living being. Sensors typically record conditions present in an environment and the information recorded by the sensors is later accessed by a user. Operating conditions of computing devices, machinery, or vehicles can be identified and/or adjusted based on information generated by sensors. Additionally, information generated by sensors can be used to control the operation of medical devices, ensure the safety of an environment, and indicate whether or not conditions within a process flow have been completed.

SUMMARY OF THE DISCLOSURE

A semiconductor device can detect whether one or more conditions have occurred. The semiconductor device can include a reservoir of ions. In various examples, the ions can be ions of one or more metals. In addition, the semiconductor device can include a plurality of metal-oxide semiconductor (MOS) devices to control diffusion of the metal ions from the reservoir into one or more channel regions of the plurality of MOS devices.

In addition, a semiconductor device can comprise a reservoir of ions having an outer shell and an interior region. The ions can be disposed in the interior region and the outer shell can be comprised of one or more metals. Further, the semiconductor device can include one or more silicon oxide regions disposed adjacent to the reservoir of ions and one or more channel regions disposed below the reservoir and below the one or more silicon oxide regions. The one or more channel regions can comprise one or more metal oxide-containing materials. The semiconductor device can also include an ion diffusion control device coupled to the reservoir and including the one or more channel regions. An electric field generated by the ion diffusion control device can control diffusion of the ions from the reservoir into the one or more channel regions.

In one or more examples, a process can comprise providing an amount of ions and contacting a reservoir region of a semiconductor device with the amount of the ions such that the amount of the ions is stored in the reservoir region. The semiconductor device can comprise one or more silicon oxide regions disposed adjacent to the reservoir of ions and one or more channel regions disposed below the reservoir and below the one or more silicon oxide regions. The one or more channel regions can comprise one or more metal oxide-containing materials. The process can include detecting that a condition has been detected by the semiconductor device based on determining that at least a threshold amount of the ions are present in at least a portion of the one or more channel regions.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various implementations discussed in the present document.

DETAILED DESCRIPTION

Figure 1:
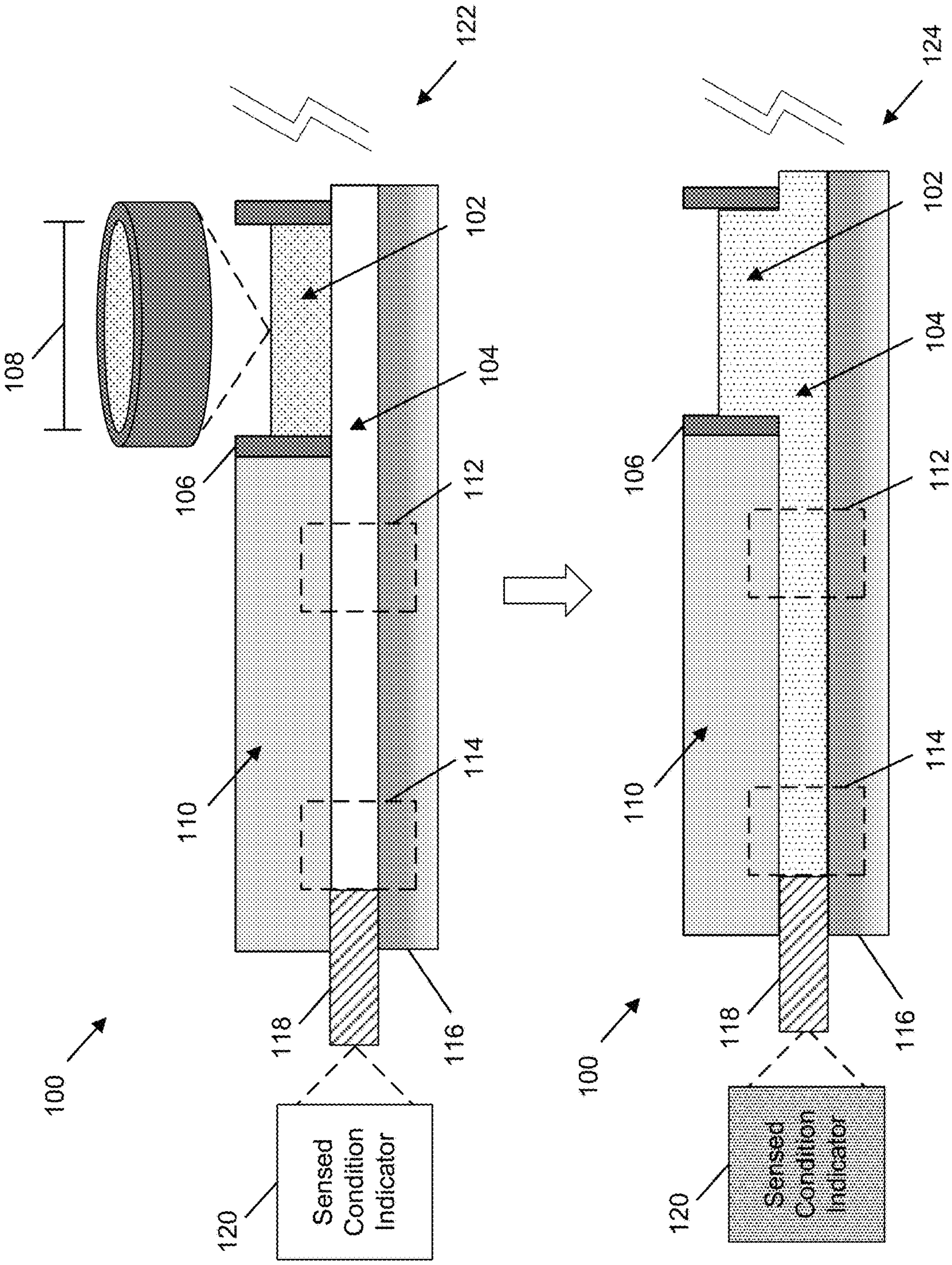
FIG. 1 is a diagram depicting a cross-section of at least a portion of an example semiconductor device having one or more ion diffusion control devices to control diffusion of ions from a reservoir into a channel region to indicate an environmental condition.

Information generated by sensors can be used by people, machines, and/or computing devices to make various decisions. In various examples, the decisions can be related to the safety and well-being of one or more people, animals, or environments. Additionally, information generated by sensors can indicate errors in one or more processes, proper functioning of machinery, can be used to generate alerts, and the like. For these reasons, a relatively high level of accuracy and reliable accessibility for information generated by sensors can be design considerations for sensors. Typically, data generated by sensors is stored and/or accessed using computer-readable memory devices. In many situations, sensor data stored by computer-readable memory devices is not accessible in situations where power is unavailable to the computer-readable memory devices.

Implementations described herein are directed to sensors that include semiconductor devices that cause ions to diffuse into channel regions of the semiconductor devices under one or more conditions. The detection of the ions in the channel regions can indicate that the one or more conditions have occurred. In one or more previously implemented configurations, diffusion of ions can be difficult to control and can be limited in the data that can be recorded. The implementations described herein are different from existing techniques because diffusion of the ions is better controlled through the use of metal-oxide semiconductor (MOS) devices. In various examples, the materials that comprise the ions and the materials that comprise the channel regions are selected to enable the efficient diffusion of ions into the channel regions in response to the sensors being subjected to one or more conditions. In this way, the sensor implementations described herein can have flexibility in the conditions being detected because different combinations of ions and oxide materials can be selected to sense one or more different conditions. Additionally, the semiconductor-based sensors described herein can be implemented without the use of external power or with minimal external power. In this way, the semiconductor devices herein can detect conditions without relying on the presence of an external power source and are, therefore, more reliable than conventional sensors that rely on the storage of data by computer-readable memory devices. Further, by enabling ions to move into the channel region in the presence of one or more conditions, the semiconductor devices described herein can operate as a memory device that records instances of one or more conditions taking place with minimal or no external power.

In various examples, the amount of ions present in the semiconductor devices used to detect the presence of one or more conditions is on the order of the amount of contaminants allowed by various silicon device fabrication specifications. Thus, the semiconductor devices described herein can be manufactured in typical silicon device fabrication facilities. Additionally, the semiconductor devices described herein include primary and secondary barriers to keep metal ions from diffusing out of the sensor device in order to minimize or eliminate contamination of devices that may be coupled to the semiconductor-based sensors.

FIG. 1 is a diagram depicting a cross-section of at least a portion of an example semiconductor device 100 having one or more ion diffusion control devices to control diffusion of ions from a reservoir 102 into a channel region 104 to indicate a condition detected by the semiconductor device 100. The reservoir 102 can include an interior region in which the ions are disposed and that is encased by an outer shell 106. The interior region of the reservoir 102 can be comprised of one or more oxide-containing materials. In various examples, the interior region of the reservoir 102 can be comprised of silicon dioxide. The outer shell 106 can be comprised of one or more metallic materials. In one or more examples, the outer shell 106 can be comprised of aluminum, one or more alloys of aluminum, copper, one or more alloys of copper, or one or more combinations thereof. The reservoir 102 can have a diameter 108. The diameter 108 can be at least 0.1 micrometers (μm), at least 0.5 μm, at least 1 μm, at least 10 μm, at least 25 μm, at least 50 μm, at least 75 μm, at least 100 μm, at least 125 μm, at least 150 μm, at least 175 μm, at least 200 μm, at least 250 μm, at least 300 μm, at least 400 μm, or at least 500 μm. In one or more illustrative examples, the diameter 108 can be from about 0.1 μm to about 500 μm, from about 0.1 μm to about 1 μm, from about 1 μm to about 10 μm, from about 1 μm to about 50 μm, from about 10 μm to about 100 μm, from about 100 μm to about 200 μm, from about 200 μm to about 300 μm, from about 150 μm to about 250 μm, from about 300 μm to about 400 μm, from about 250 μm to about 500 μm, from about 100 μm to about 300 μm, or from about 400 μm to about 500 μm.

The ions stored by the reservoir 102 can include ions of one or more metals. In various examples, the reservoir 102 can store ions of one or more Group 1 elements. For example, the reservoir 102 can store positively charged ions of at least one of hydrogen, lithium, sodium, or potassium. In one or more examples, the reservoir 102 can store ions of one or more Group 2 elements. To illustrate, the reservoir 102 can store positively charged ions of at least one of beryllium, magnesium, or calcium. In still other examples, the reservoir 102 can store ions of one or more transition metals. In one or more additional examples, the reservoir 102 can store positively charged ions of at least one of manganese, iron, cobalt, nickel, copper, zinc, silver, or gold. In one or more further examples, the reservoir 102 can store ions of elements different from metals. In one or more illustrative examples, the reservoir 102 can store ions of one or more Group 17 elements. For example, the reservoir 102 can store negatively charged ions of at least one of fluorine or chlorine.

In various examples, the semiconductor device 100 can operate as a sensor and the ions stored by the reservoir 102 can correspond to a condition to be sensed by the semiconductor device 100. In one or more examples, the semiconductor device 100 can operate as a temperature sensor. In these scenarios, the ions stored by the reservoir 102 can have properties that enable the ions to move through the channel region 104 at the temperatures to be detected or to move through the channel region 104 in accordance with a temperature change to be detected. In one or more additional examples, the semiconductor device 100 can operate as a pressure sensor. In these situations, the ions stored by the reservoir 102 can have properties that enable the ions to move through the channel region 104 at the pressures to be detected or that enable the ions to move through the channel region 104 in accordance with a pressure change to be detected. In still other examples, the semiconductor device 100 can operate as a voltage sensor. For example, the ions stored by the reservoir 102 can have properties that enable the ions to move through the channel region 104 in response to being subjected to at least at threshold voltage. In one or more further examples, the semiconductor device 100 can operate as a photo sensor, such as a visible light sensor. To illustrate, the ions stored by the reservoir 102 can have properties that enable the ions to absorb energy in response to visible light such that the ions absorb sufficient energy to overcome an activation voltage of the semiconductor device 100 and move into the channel region 104 when exposed to visible light for at least a threshold duration. In at least some examples, the semiconductor device 100 can operate as a sensor of additional ranges of electromagnetic radiation. In one or more illustrative examples, the ions stored by the reservoir 102 can have properties that enable the ions to absorb energy when exposed to electromagnetic radiation having one or more wavelength ranges. The ions can absorb sufficient energy to overcome an activation voltage of the semiconductor device 100 and move into the channel region 104.

The channel region 104 can be comprised of one or more oxide materials. In one or more examples, the channel region 104 can be comprised of one or more metal oxide materials. For example, the channel region 104 can be comprised of one or more oxides of silicon, one or more oxides of germanium, one or more oxides of copper, one or more oxides of cobalt, one or more oxides of iron, one or more oxides of titanium, one or more oxides of tin, one or more oxides of indium, or one or more combinations thereof. In one or more illustrative examples, the channel region 104 can be comprised of $SnO_2$, ZnO, $Fe_2O_3$, $TiO_2$, $In_2O_3$, $Co_3O_4$, CuO, $SiO_2$, or one or more combinations thereof. In various examples, the one or more oxide materials of the channel region 104 and the ions stored by the reservoir 102 can be selected in one or more specified combinations to enable efficient diffusion of the metal ions into the channel region 104 from the reservoir 102 based on one or more conditions being sensed by the semiconductor device 100.

The semiconductor device 100 can also include an oxide region 110 that is disposed adjacent to the reservoir 102. In one or more examples, the oxide region 110 can be comprised of one or more metal oxide materials. In one or more illustrative examples, the oxide region 110 can be comprised of one or more silicon oxides. For example, the oxide region 110 can be comprised of silicon dioxide ($SiO_2$). In various examples, the oxide region 110 can include one or more layers of one or more metal oxide materials. Additionally, one or more electrical components can be disposed in the oxide region 110. To illustrate, one or more electrical contacts can be disposed in the oxide region 110. Further, one or more vias can be disposed in the oxide region 110. In at least some examples, one or more gate electrical contacts can be disposed in the oxide region 110. In addition, one or more source electrical contacts can be disposed in the oxide region 110. In still other examples, one or more drain electrical contacts can be disposed in the oxide region 110. Conductive pathways and connectors can also be disposed in the oxide region 110 that are configured to transport current through the semiconductor device 100. In various examples, one or more metallic structural layers can be disposed in the oxide region 110. The one or more metallic structural layers can provide separation between portions of the semiconductor device 100 and/or provide structural stability for the semiconductor device 100.

In one or more examples, the semiconductor device 100 can include a first ion diffusion control device 112 and a second ion diffusion control device 114. In at least some examples, the first ion diffusion control device 112 can comprise a first metal-oxide semiconductor (MOS) device and the second ion diffusion control device 114 can comprise a second MOS device. For example, the first ion diffusion control device 112 can include a first gate region of a first MOS device and the second ion diffusion control device 114 can include a second gate region of a second MOS device. The first gate region of the first MOS device can be connected in series with the second gate region of the second MOS device. In one or more illustrative examples, the first ion diffusion control device 112 and the second ion diffusion control device 114 can include respective gate regions having one or more polysilicon gate structures. In various examples, the first ion diffusion control device 112 and the second ion diffusion control device 114 can include respective gate regions that share a polysilicon gate structure. Additionally, in implementations where the first ion diffusion control device 112 is a first MOS device and the second ion diffusion control device 114 is a second MOS device, the channel region 104 can be configured as a channel of the first MOS device and the second MOS device.

The first ion diffusion control device 112 can include at least one of a first drain region or a first source region. Further, the second ion diffusion control device 114 can include at least one of a second drain region or a second source region. In various examples, the first ion diffusion control device 112 and the second ion diffusion control device 114 can share at least one of a common drain region or a common source region. In one or more examples, the first ion diffusion control device 112 and the second ion diffusion control device 114 can include one or more source electrical contacts and one or more drain electrical contacts. In one or more additional examples, the first ion diffusion control device 112 and the second ion diffusion control device 114 can include at least one of one or more source electrical contacts or one or more drain electrical contacts disposed in the oxide region 110. In one or more illustrative examples, the first ion diffusion control device 112 and the second ion diffusion control device 114 can share a common source electrical contact and/or share a common drain electrical contact disposed in the oxide region 110.

The semiconductor device 100 can also include a silicon region 116 that is disposed below the channel region 104. The silicon region 116 can include a number of regions that include one or more concentrations of one or more dopants. For example, one or more regions of the silicon region 116 can include one or more concentrations of at least one of one or more n-type dopants or one or more p-type dopants. In various examples, the silicon region 116 can include one or more regions that are doped with n-type dopants that include at least one of phosphorus, arsenic, antimony, or bismuth. In one or more illustrative examples, the silicon region 116 can include one or more regions that include n-type dopants that correspond to at least one of a drain region or a source region of the first ion diffusion control device 112 and/or at least one of a drain region or a source region of the second ion diffusion control device 114. In one or more additional examples, one or more regions of the silicon region 116 can include one or more regions that are doped with p-type dopants that include at least one of indium, gallium, boron, or aluminum. In one or more examples, a concentration of n-type dopants, a concentration of p-type dopants, or the concentration of both n-type dopants and p-type dopants in the silicon region 116 can vary depending on a desired electrical profile within the silicon region 116.

Further, the semiconductor device 100 can include detection circuitry 118. The detection circuitry 118 can be electrically coupled to at least one of the first ion diffusion control device 112 or the second ion diffusion control device 114. In one or more examples, the detection circuitry 118 can be configured to detect the presence of ions within the channel region 104. In various examples, the detection circuitry 118 can be configured to detect at least a threshold concentration of ions in the channel region 104. In at least some examples, the channel region 104 can become conductive in response to a threshold concentration of ions being present in the channel region 104. The detection circuitry 118 can be configured to enable an applied voltage to produce current of at least a threshold value within the detection circuitry 118 in response to at least a threshold concentration of ions being present in the channel region 104. The detection circuitry 118 can include at least one of one or more one or more electrical contacts or one or more metallic connectors. The one or more metallic connectors can include at least one of lines or plates that couple components of the semiconductor device 100. In various examples, the silicon region 116 can include one or more regions of at least one of n-type dopants or p-type dopants that correspond to the detection circuitry 118.

The semiconductor device 100 can include or be coupled to a sensed condition indicator 120. The sensed condition indicator 120 can provide at least one of a visual indication or an audio indication that a condition has been sensed by the semiconductor device 100. In one or more examples, the sensed condition indicator 120 can be coupled directly or indirectly to the detection circuitry 118. In one or more illustrative examples, the sensed condition indicator 120 can include an analog device that at least one of changes color, activates a light, or activates a buzzer in response to current being detected by the detection circuitry 118 in response to an applied voltage based on ions being present in the channel region 104. In at least some examples, the sensed condition indicator 120 can be included in a control panel of a piece of equipment or machinery. In one or more additional illustrative examples, the sensed condition indicator 120 can be included in a user interface that is accessible using a computing device. In various examples, the user interface can display a user interface element that visually indicates that a condition has been detected by the semiconductor device 100. For example, the user interface can include a user interface element that indicates a condition being detected by the semiconductor device using at least one of one or more shapes, one or more colors, one or more alphanumeric characters, or one or more symbols.

In one or more examples, the first ion diffusion control device 112 can produce a first electric field and the second ion diffusion control device 114 can produce a second electric field. At least one of the first electric field or the second electric field can prevent or minimize diffusion of ions from the reservoir 102 into the channel region 104. In various examples, the first electric field of the first ion diffusion control device 112 can be generated by a first P-N junction that is formed from doped regions located in the silicon region 116. Additionally, the second electric field of the second ion diffusion control device 114 can be generated by a second P-N junction that is formed from one or more additional doped regions located in the silicon region 116. In one or more illustrative examples, a first magnitude of the first electric field of the first ion diffusion control device 112 can be greater than a second magnitude of the second electric field of the second ion diffusion control device 114. In response to the semiconductor device 100 being exposed to one or more conditions, the first magnitude of first electric field of the first ion diffusion control device 112 and the second magnitude of the second electric field of the second ion diffusion control device 114 can be reduced such that ions stored in the reservoir 102 can diffuse into the channel region 104. In at least some examples, the first electric field of the first ion diffusion control device 112 and the second electric field of the second ion diffusion control device 114 can dissipate in response to the semiconductor device 100 being exposed to one or more conditions.

As shown in the illustrative example of FIG. 1, the semiconductor device 100 can move from a first state 122 in which a first concentration of ions is present in the channel region 104 to a second state 124 in which a second concentration of ions is present in the channel region 104. The second concentration of ions present in the channel region 104 in the second state 124 can be greater than a first concentration of ions present in the channel region 104 in the first state 122. In one or more examples, ions can be absent from the channel region 104 in the first state 122. In situations when a voltage is applied to the detection circuitry 118 when the semiconductor device 100 is in the first state 122, a threshold current may not be detected by the detection circuitry 118 and the sensed condition indicator 120 can indicate the absence of one or more conditions. In one or more additional scenarios, when a voltage is applied to the detection circuitry 118 when the semiconductor device 100 is in the second state 124, a threshold current can be detected by the detection circuitry 118 and the sensed condition indicator 120 can indicate the presence of one or more conditions. In at least some instances, the decrease in the electric fields of at least one of the first ion diffusion control device 112 or the second ion diffusion control device 114 can take place without external power being supplied to the semiconductor device 100. For example, the ions stored by the reservoir 102, one or more materials of the channel region 104, and components of the first ion diffusion control device 112 and the second ion diffusion control device 114 can be selected and configured such that the first electric field of the first ion diffusion control device 112 and the second electric field of the second ion diffusion control device 114 decrease to a value that enables the ions to diffuse from the reservoir 102 into the channel region 104 in response to being exposed to one or more conditions and without an external voltage being applied to the semiconductor device 100. To illustrate, in response to exposure to at least one of one or more temperature conditions or one or more pressure conditions for at least a threshold duration, the electric fields of the ion diffusion control devices 112, 114 can decrease to a magnitude that causes ions stored by the reservoir 102 to diffuse into the channel region 104.

Figure 2:
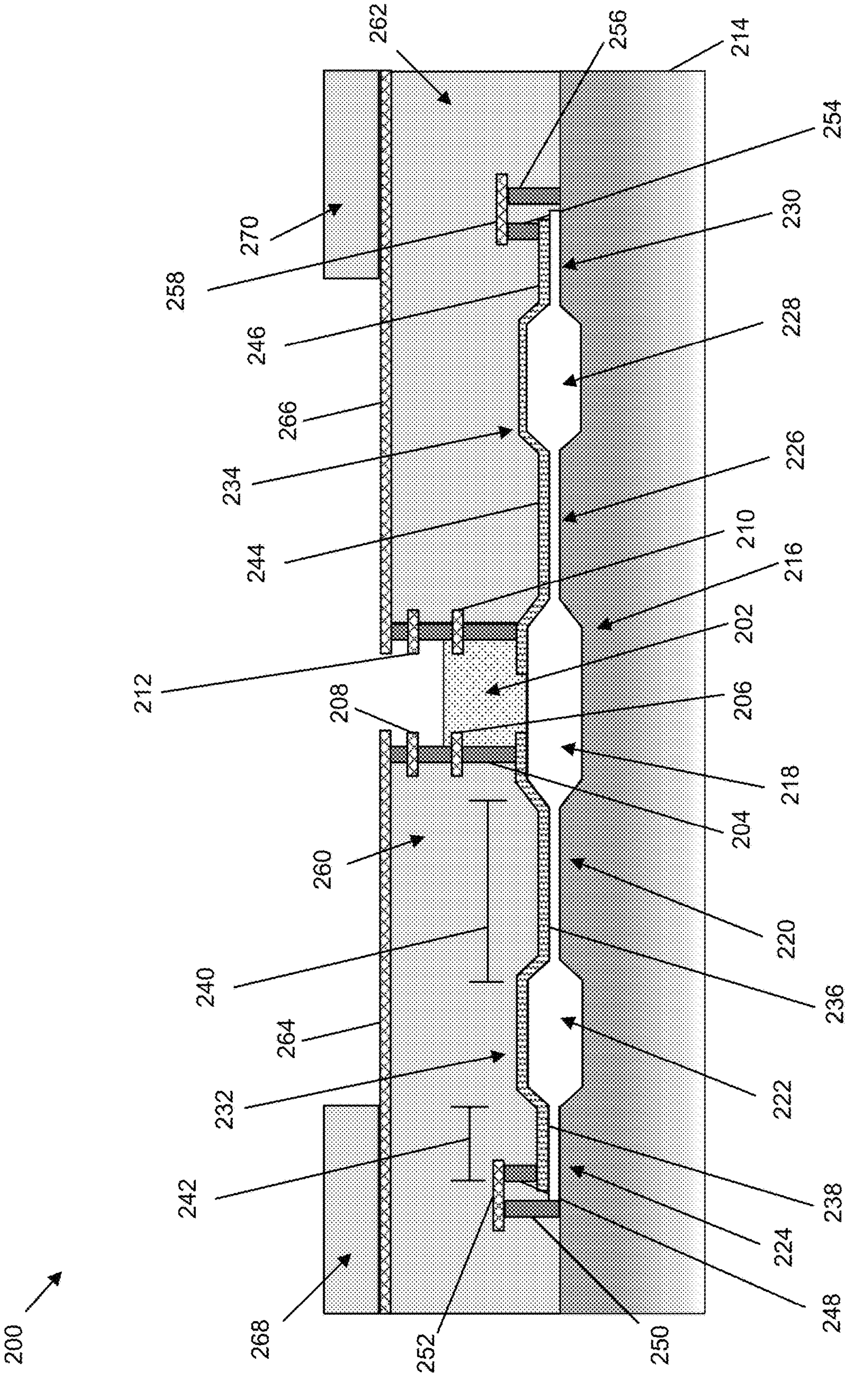
FIG. 2 is a diagram depicting a cross-section of at least a portion of an example semiconductor device including a reservoir of ions and one or more metal-oxide semiconductor devices to control diffusion of the ions out of the reservoir.

FIG. 2 is a diagram depicting a cross-section of at least a portion of an example semiconductor device 200 including a reservoir 202 of ions and one or more metal-oxide semiconductor devices to control diffusion of the ions out of the reservoir 202. The semiconductor device 200 can include an outer shell 204 for the reservoir 202. In various examples, an interior region of the reservoir 202 can be encased in one or more materials that minimize or prevent the diffusion of ions out of the reservoir 202 in a lateral direction, such as diffusion of ions into one or more layers disposed adjacent to the reservoir 202. The outer shell 204 can be formed by one or more vias. In one or more examples, the outer shell 204 can comprise one or more metallic materials. In at least some examples, the outer shell 204 can be formed from one or more materials having a density that is greater than a density of the ions stored by the reservoir 202.

In one or more illustrative examples, a concentration of ions disposed in the reservoir 202 can be at least $0.5\times10^{10}$ $cm^{-3}$, at least $1\times10^{10}$ $cm^{-3}$, at least $5\times10^{10}$ $cm^{-3}$, at least $10\times10^{10}$ $cm^{-3}$, at least $15\times10^{10}$ $cm^{-3}$, at least $20\times10^{10}$ $cm^{-3}$, at least $25\times10^{10}$ $cm^{-3}$, at least $30\times10^{10}$ $cm^{-3}$, at least $40\times10^{10}$ $cm^{-3}$, at least $50\times10^{10}$ $cm^{-3}$, at least $75\times10^{10}$ $cm^{-3}$, or at least $100\times10^{10}$ $cm^{-3}$. In one or more additional illustrative examples, a concentration of ions disposed in the reservoir 202 can be from about $0.5\times10^{10}$ $cm^{-3}$ to about $100\times10^{10}$ $cm^{-3}$, from about $1\times10^{10}$ $cm^{-3}$ to about $50\times10^{10}$ $cm^{-3}$, from about $1\times10^{10}$ $cm^{-3}$ to about $10\times10^{10}$ $cm^{-3}$, from about $10\times10^{10}$ $cm^{-3}$ to about $30\times10^{10}$ $cm^{-3}$, or from about $20\times10^{10}$ $cm^{-3}$ to about $50\times10^{10}$ $cm^{-3}$. In various examples, the reservoir 202 can store ions of at least one of one or more alkali metals, one or more alkaline earth metals, one or more transition metals, or one or more halides.

One or more electrical contacts can be disposed in the outer shell 204. For example, the outer shell 204 can include a first electrical contact 206, a second electrical contact 208, a third electrical contact 210, and a fourth electrical contact 212. The electrical contacts 206, 208, 210, 212 can be formed from one or more metallic materials. To illustrate, the electrical contacts 206, 208, 210, 212 can be formed from copper, one or more alloys of copper, titanium, one or more alloys of titanium, tungsten, one or more alloys of tungsten, lead, one or more alloys of lead, or one or more combinations thereof. In at least some examples the electrical contacts 206, 208, 210, 212 can be formed from one or more metallic materials different from one or more metallic metals used to form the outer shell 204.

The semiconductor device 200 can also include a silicon substrate 214. The silicon substrate 214 can be comprised of one or more layers of silicon. The silicon substrate 214 can include one or more regions that are doped with at least one of one or more n-type materials, or one or more p-type materials. Additionally, the silicon substrate 214 can include regions having different concentrations of n-type dopants, regions having different concentrations of p-type dopants, or a combination thereof. In one or more examples, the silicon substrate 214 can have a thickness from about 100 nm to about 500 μm, from about 500 nm to about 100 μm, from about 100 nm to about 1 μm, from about 1 μm to about 100 μm, from about 100 μm to about 250 μm, from about 250 μm to about 500 μm, or from about 200 μm to about 400 μm.

The semiconductor device 200 can include a channel region 216 that is disposed below the reservoir 202. The channel region 216 can be formed from one or more metal oxide materials. In one or more illustrative examples, the channel region 216 can comprise silicon dioxide. The channel region 216 can be configured such that the ions stored by the reservoir 202 can diffuse into the channel region 216 under one or more specified conditions. The channel region 216 can include one or more sections. In various examples, the channel region 216 can include a contiguous region that is comprised of a plurality of sections. In one or more examples, the channel region 216 can include a number of expanded regions and a number of constricted regions. The individual expanded regions can have a height that is greater than a height of the individual constricted regions. In one or more illustrative examples, the individual expanded regions can have a height that is at least 2 times a height of individual constricted regions, at least 3 times a height of individual constricted regions, at least 4 times a height of individual constricted regions, at least 5 times a height of individual constricted regions, at least 8 times a height of individual constricted regions, or at least 10 times a height of individual constricted regions. In various examples, the heights of the individual expanded regions can be within at least 1% of one another, within at least 2% of one another, within at least 3% of one another, within at least 4% of one another, within at least 5% of one another, within at least 8% of one another, within 10% of one another, within 15% of one another, within 20% of one another, or within 25% of one another. Further, heights of the individual constricted sections can be within at least 1% of one another, within at least 2% of one another, within at least 3% of one another, within at least 4% of one another, within at least 5% of one another, within at least 8% of one another, within 10% of one another, within 15% of one another, within 20% of one another, or within 25% of one another. In the illustrative example of FIG. 2, the channel region 216 can include a first expanded region 218, a first constricted region 220, a second expanded region 222, a second constricted region 224, a third constricted region 226, a third expanded region 228, and a fourth constricted region 230.

The channel region 216 can comprise a channel of a number of metal-oxide semiconductor (MOS) devices. In one or more examples, a first gate structure 232 can be disposed over a first portion of the channel region 216 and second gate structure 234 can be disposed over a second portion of the channel region 216. The first gate structure 232 and the second gate structure 234 can be comprised of one or more metallic materials. In one or more additional examples, the first gate structure 232 and the second gate structure 234 can be comprised of one or more silicon-containing materials. For example, the first gate structure 232 and the second gate structure 234 can be comprised of polycrystalline silicon.

In one or more examples, the first gate structure 232 can include a first gate region 236 and a second gate region 238. The first gate region 236 can correspond to a first MOS device having a channel comprised of the first constricted region 220. The second gate region 238 can correspond to a second MOS device having a channel comprised of the second constricted region 224. In various examples, a first electric field can be formed in relation to the first gate region 236 and a second electric field can be formed in relation to the second gate region 238. The first electric field can have a first magnitude that is greater than a second magnitude of the second electric field. In this way, the first electric field can prevent or minimize diffusion of ions from the reservoir 202 into the channel region 216 and the second electric field can be used to indicate the presence of at least a minimum concentration of ions in the channel region 216.

The first gate region 236 can have a first length 240 and the second gate region 238 can have a second length 242. In one or more examples, the first length 240 can be greater than the second length 242. In one or more illustrative examples, the first length 240 can be from about 20 nm to about 100 nm, from about 20 nm to about 80 nm, from about 20 nm to about 60 nm, from about 40 nm to about 80 nm, from about 20 nm to about 40 nm, or from about 30 nm to about 50 nm. In one or more additional illustrative examples, the second length 242 can be from about 5 nm to about 25 nm, from about 10 nm to about 20 nm, or from about 5 nm to about 15 nm.

In various examples, the second gate structure 234 can include a third gate region 244 and a fourth gate region 246. The third gate region 244 can correspond to a third MOS device having a channel comprised of the third constricted region 226. The fourth gate region 246 can correspond to a fourth MOS device having a channel comprised of the fourth constricted region 230. In various examples, a third electric field can be formed in relation to the third gate region 244 and a fourth electric field can be formed in relation to the fourth gate region 246. The third electric field can have a third magnitude that is greater than a fourth magnitude of the third electric field. In this way, the third electric field can prevent or minimize diffusion of ions from the reservoir 202 into the channel region 216 and the fourth electric field can be used to indicate the presence of at least a minimum concentration of ions in the channel region 216. In one or more examples, the third magnitude of the third electric field can be similar to the first magnitude of the first electric field and the fourth magnitude of the fourth electric field can be similar to the second magnitude of the second electric field.

The MOS devices of the semiconductor device 200 can include additional components. For example, the semiconductor device 200 can include a first source connector 248 that is coupled to the first gate structure 232. In one or more examples, at least a portion of a surface of the first source connector 248 can be in direct contact with at least a portion of a surface of the first gate structure 232. The semiconductor device 200 can also include a second source connector 250 that is coupled to the first source connector 248 by a first source electrical contact 252. In at least some examples, the second source connector 250 can be coupled to a source region within the silicon substrate 214 that comprises a concentration of one or more dopants. The first source connector 248, the second source connector 250, and the first source electrical contact 252 can be electrically coupled to the first gate region 236 and the second gate region 238.

In one or more scenarios, the first source connector 248, the second source connector 250, and the first source electrical contact 252 can comprise a common source for the first MOS device that includes the first gate region 236 and for the second MOS device that includes the second gate region 238. The first source connector 248, the second source connector 250, and the first source electrical contact 252 can be formed from one or more metallic materials. In various examples, at least one of the first source connector 248, the second source connector 250, or the first source electrical contact 252 can be formed from one or more metallic materials different from one or more additional metallic materials used to form another one of the first source connector 248, the second source connector 250, or the first source electrical contact 252.

Additionally, the semiconductor device 200 can include a third source connector 254 that is coupled to the second gate structure 234. In one or more examples, at least a portion of a surface of the third source connector 254 can be in direct contact with at least a portion of a surface of the second gate structure 234. The semiconductor device 200 can also include a fourth source connector 256 that is coupled to the third source connector 254 by a second source electrical contact 258. In at least some examples, the fourth source connector 256 can be coupled to a source region within the silicon substrate 214 that comprises a concentration of one or more dopants. The third source connector 254, the fourth source connector 256, and the second source electrical contact 258 can be electrically coupled to the third gate region 244 and the fourth gate region 246. In one or more scenarios, the third source connector 254, the fourth source connector 256, and the second source electrical contact 258 can comprise a common source for the third MOS device that includes the third gate region 244 and for the fourth MOS device that includes the fourth gate region 246. The third source connector 254, the fourth source connector 256, and the second source electrical contact 258 can be formed from one or more metallic materials. In various examples, at least one of the third source connector 254, the fourth source connector 256, or the second source electrical contact 258 can be formed from one or more metallic materials different from one or more additional metallic materials used to form another one of the third source connector 254, the fourth source connector 256, or the second source electrical contact 258.

The semiconductor device 200 can include a number of oxide regions disposed adjacent to the reservoir 202. Additionally, the number of oxide regions can be disposed over at least portion of the individual MOS devices of the semiconductor device 200. For example, the semiconductor device 200 can include a first oxide region 260 and a second oxide region 262. In one or more examples, the first oxide region 260 and the second oxide region 262 can be comprised of silicon dioxide ($SiO_2$). In at least some examples, the first oxide region 260 and the second oxide region 262 can be comprised of one or more layers of $SiO_2$.

The semiconductor device 200 can also include a first barrier structure 264 disposed on the first oxide region 260 and a second barrier structure 266 disposed on the second oxide region 262. The first barrier structure 264 and the second barrier structure 266 can be comprised of one or more metallic materials. In at least some examples, the first barrier structure 264 and the second barrier structure 266 can be configured to minimize or prevent ions from being diffused into the first oxide region 260 and the second oxide region 262 during one or more processes to cause the ions to be disposed in the reservoir 202. Additionally, the semiconductor device 200 can include a third oxide region 268 disposed on the first barrier structure 264 and a fourth oxide region 270 disposed on the second barrier structure 266. In one or more illustrative examples, the third oxide region 268 and the fourth oxide region 270 can be comprised of one or more layers of $SiO_2$. In various examples, the third oxide region 268 and the fourth oxide region 270 can provide mechanical stability for the semiconductor device 200. Further, the third oxide region 268 and the fourth oxide region 270 can provide a barrier to protect one or more underlying metal layers of the semiconductor device 200. The third oxide region 268 and the fourth oxide region 270 can be set back from the reservoir 202 such that contamination of the third oxide region 268 and/or the fourth oxide region 270 by ions stored by the reservoir 202 is reduced or eliminated.

In one or more examples, implementations of the semiconductor device 200 can correspond to one or more illustrative examples of the semiconductor device 100 described with respect to FIG. 1. For example, the semiconductor device 200 can operate as a sensor to detect one or more conditions. In addition, the semiconductor device 200 can operate to record the presence of one or more conditions with minimal or no external power supply.

Figure 3:
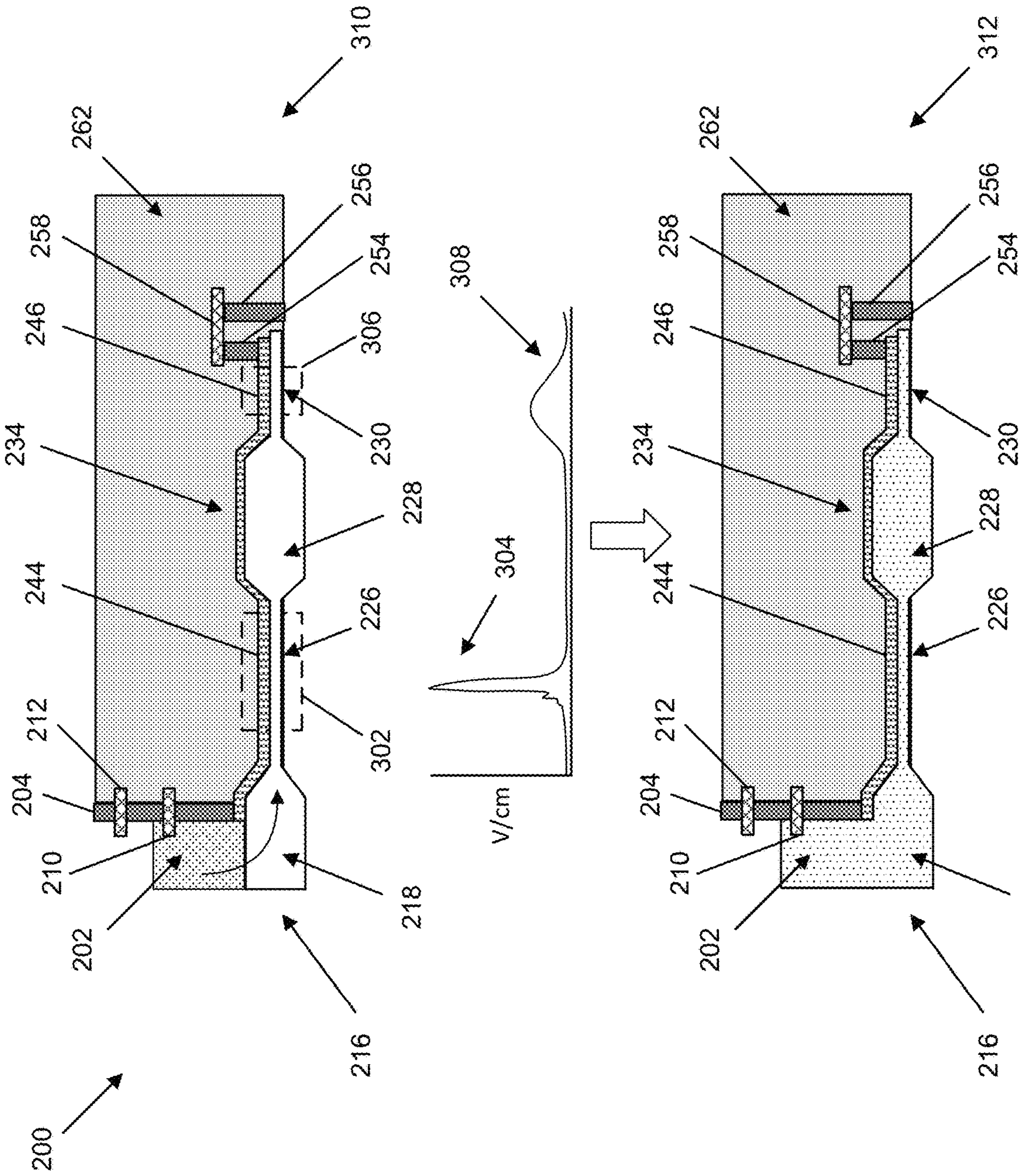
FIG. 3 is a diagram depicting a cross-section of a portion of an example semiconductor device including a first metal-oxide semiconductor device having a first activation voltage and a second metal-oxide semiconductor device having a second activation voltage that is less than the first activation voltage and showing diffusion of ions from a reservoir into a channel region.

FIG. 3 is a diagram depicting a cross-section of a portion of an example semiconductor device 200 including a first metal-oxide semiconductor (MOS) device 302 having a first activation voltage 304 and a second MOS device 306 having a second activation voltage 308 that is less than the first activation voltage 304 and showing diffusion of ions from a reservoir 202 into a channel region 216. In one or more examples, the semiconductor device 200 can be in a first state 310 with the ions being disposed in the reservoir 202. When the semiconductor device 200 is in the first state 310, the number of ions in the channel region 216 can be less than a threshold concentration. In various examples, the threshold concentration can be a minimum concentration of ions that can cause current to be detected across at least one of the first MOS device 302 or the second MOS device 306. Additionally, when the semiconductor device 200 is in the first state 310 a first electric field produced in relation to the first MOS device 302 can block or minimize diffusion of ions from the reservoir 202 into the channel region 216.

As shown in the illustrative example of FIG. 3, the first activation voltage 304 can have a magnitude that is greater than the second activation voltage 308. In one or more examples, the magnitude of the first activation voltage 304 can correspond to a difference in concentration of n-type dopants in a silicon region below the first expanded region 218, a concentration of p-type dopants in a silicon region below the third constricted region 226, and a concentration of n-type dopants in a silicon region below the third expanded region 228. Additionally, the magnitude of the second activation voltage 308 can correspond to a difference in concentration of n-type dopants in a silicon region below the third expanded region 228, a concentration of p-type dopants in a silicon region below the fourth constricted region 230, and a concentration of n-type dopants in a silicon region below the third source connector 254.

In response to one or more conditions, a voltage having a magnitude of at least the first activation voltage 304 can be produced across at least one of the first MOS device 302 or the second MOS device 306. In these scenarios, the first electric field produced in relation to the first MOS device 302 and a second electric field produced in relation to the second MOS device 306 can dissipate to a magnitude that enables the semiconductor device 200 to move from the first state 310 to the second state 312 such that ions from the reservoir 202 can diffuse into the channel region 216. In one or more examples, in the second state 312, the amount of ions present in the channel region 216 can correspond to at least a threshold concentration of ions that enables current to be detected across at least one of the first MOS device 302 or the second MOS device 306. In various examples, the activation voltage can be produced without applying an external power source to the semiconductor device 200. That is, the activation voltage can be produced in response to one or more environmental conditions to which the semiconductor device 200 is exposed.

Figure 4:
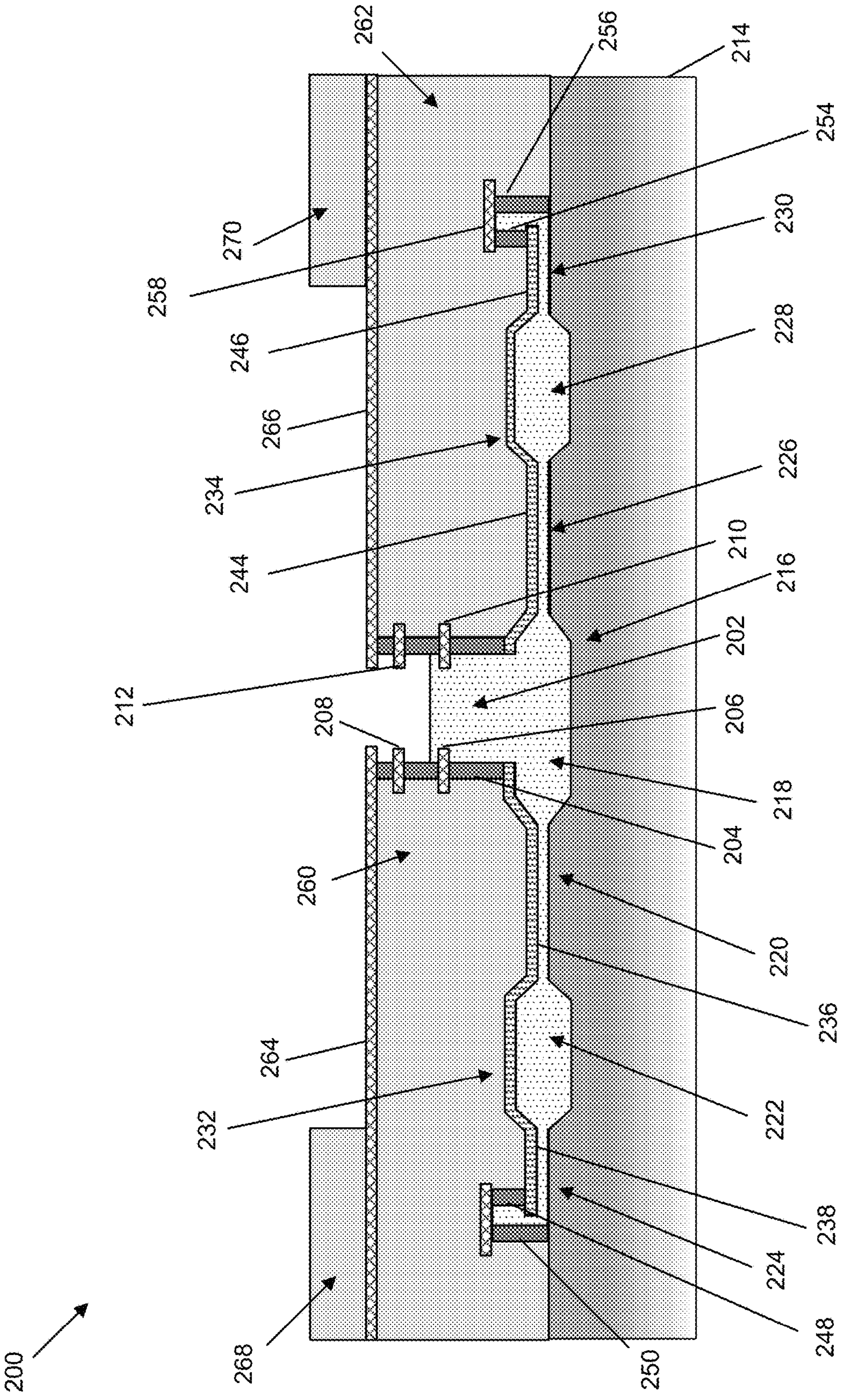
FIG. 4 is a diagram depicting a cross-section of at least a portion of an example semiconductor device including a reservoir of ions and one or more metal-oxide semiconductor devices after ions have diffused from the reservoir into a channel region.

FIG. 4 is a diagram depicting a cross-section of at least a portion of an example semiconductor device 200 including a reservoir 202 of ions and one or more metal-oxide semiconductor devices after ions have diffused from the reservoir 202 into a channel region 216. In one or more examples, the flow of ions from the reservoir 202 into the channel region 216 can take place in response to the semiconductor device 200 being exposed to one or more conditions. In various examples, the flow of ions from the reservoir 202 into the channel region 216 can take place in response to the semiconductor device 200 being exposed to one or more environmental conditions. For example, exposure to at least one of one or more temperature conditions or one or more pressure conditions can cause electric fields present in the channel region 216 to dissipate and enable ions to diffuse from the reservoir 202 into the channel region 216. In one or more illustrative examples, in response to the semiconductor device 200 being exposed to at least a threshold temperature for a minimum duration of time, the ions disposed in the reservoir 202 can diffuse into the channel region 216. In one or more additional illustrative examples, the semiconductor device 200 can be included in an autoclave. Continuing with this example, the autoclave can apply heat to one or more objects located in a chamber of the autoclave. In response to temperatures within the autoclave chamber reaching a threshold temperature for a minimum duration, the ions stored in the reservoir 202 can diffuse into the channel region 216. In this way, the semiconductor device 200 can operate as a sensor that stores information indicating that one or more autoclave cycles have been performed and that objects located in the autoclave chamber have been exposed to one or more specified conditions. In various illustrative examples, the autoclave can be used to sterilize medical equipment. In these scenarios, the semiconductor device 200 can indicate whether or not medical equipment placed in the autoclave has been exposed to one or more conditions of a sterilization process, such as being exposed to at least a minimum temperature for at least a minimum period of time. In one or more further examples, a plurality of semiconductor devices 200 can be included in the autoclave with individual instances of the semiconductor device 200 being configured to indicate completion of an individual sterilization cycle.

Figure 5:
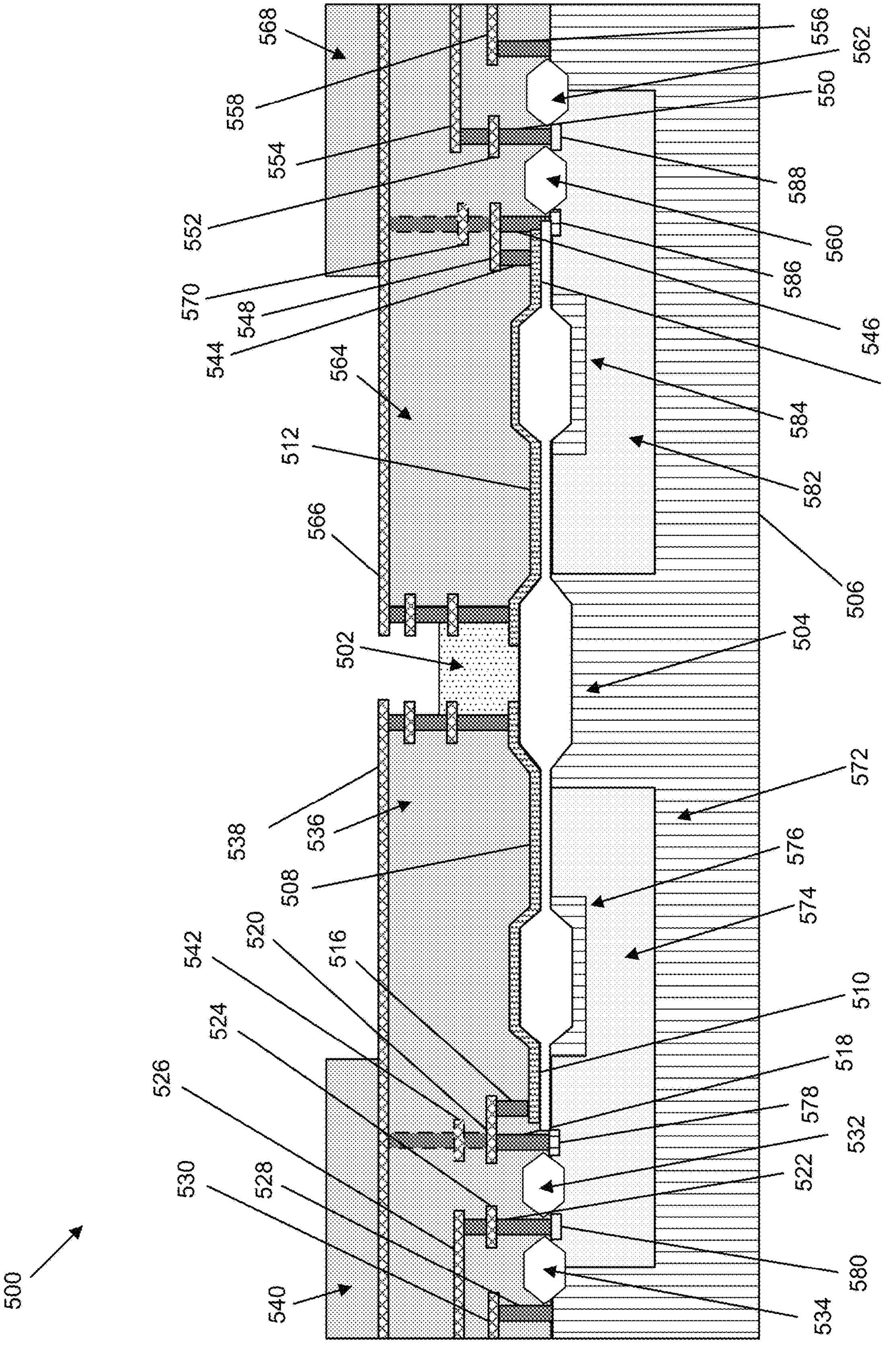
FIG. 5 is a diagram depicting an example process to produce a reservoir of ions for a semiconductor device including one or more metal-oxide semiconductor devices to control diffusion of ions out of the reservoir.

FIG. 5 is a diagram depicting a cross-section of at least a portion of an example semiconductor device 500 including a reservoir 502 of ions, one or more metal-oxide semiconductor devices to control diffusion of the metal ions out of the reservoir, and additional components configured to indicate diffusion of the ions out of the reservoir 502 and into a channel region 504. The semiconductor device 500 can correspond to the semiconductor device 200 described with respect to FIGS. 2-4 with some additional components illustrated that enable detection of ions in the channel region 504. For example, the channel region 504 can comprise a number of expanded regions and a number of constricted regions as described with respect to the channel region 216 of FIG. 2. Additionally, the semiconductor device 500 can include an outer shell of the reservoir 502 disposed in vias and a number of electrical contacts disposed within the outer shell of the reservoir 502 as described in relation to FIG. 2. Thus, although some components of FIG. 5 may not be specifically labeled, a number of features of FIG. 5 correspond to similar features or the same features of FIG. 2. Further, the semiconductor device 500 indicates the locations of dopants within a silicon region 506. In one or more illustrative examples, the reservoir 502 can include one or more oxide materials and the channel region 504 can include one or more metal oxide semiconductor materials. For example, the reservoir 502 and the channel region 504 can be comprised of silicon dioxide.

The semiconductor device 500 can include a first gate region 508 and a second gate region 510. In one or more examples the first gate region 508 and the second gate region 510 can be included in a single gate structure. In various examples, the first gate region 508 and the second gate region 510 can be included in a polycrystalline silicon gate structure. In one or more additional examples, the first gate region 508 and the second gate region 510 can be included in a metallic gate structure. In at least some examples, the first gate region 508 can be included in a first MOS device of the semiconductor device 500 and the second gate region 510 can be included in a second MOS device of the semiconductor device 500. In one or more illustrative examples, the first MOS device including the first gate region 508 and the second MOS device including the second gate region 510 can control diffusion of ions stored by the reservoir 502 into a first portion of the channel region 504 that corresponds to the first gate region 508 and the second gate region 510.

Additionally, the semiconductor device 500 can include a third gate region 512 and a fourth gate region 514. In one or more examples the third gate region 512 and the fourth gate region 514 can be included in a single gate structure. In various examples, the third gate region 512 and the fourth gate region 514 can be included in a polycrystalline silicon gate structure. In one or more additional examples, the third gate region 512 and the fourth gate region 514 can be included in a metallic gate structure. In at least some examples, the third gate region 512 can be included in a third MOS device of the semiconductor device 500 and the fourth gate region 514 can be included in a fourth MOS device of the semiconductor device 500. In one or more illustrative examples, the third MOS device including the third gate region 512 and the fourth MOS device including the fourth gate region 514 can control diffusion of ions stored by the reservoir 502 into a second portion of the channel region 504 that corresponds to the third gate region 512 and the fourth gate region 514.

The semiconductor device 500 can include a first source connector 516 and a second source connector 518. In addition, the semiconductor device 500 can include a first source electrical contact 520. Further, the semiconductor device 500 can include components of first detection circuitry that can be used to indicate the presence or absence of at least a threshold amount of ions in the first portion of the channel region 504 that includes the first gate region 508 and the second gate region 510. The first detection circuitry can include a first additional connector 522, a first additional electrical contact 524 coupled to the first additional connector 522, and a second additional electrical contact 526 coupled to the first additional connector 522. The first detection circuitry can also include a second additional connector 528 and a third additional electrical contact 530 coupled to the second additional connector 528. In one or more examples, a first metal oxide region 532 can be disposed between the second source connector 518 and the first additional connector 522 and a second metal oxide region 534 can be disposed between the first additional connector 522 and the second additional connector 528. In various examples, the first metal oxide region 532 and the second metal oxide region 534 can comprise silicon dioxide.

Further, the semiconductor device 500 can include a first oxide region 536 adjacent to the reservoir 502, a first barrier structure 538 disposed on the first oxide region 536, and a second oxide region 540 disposed on the first barrier structure 538. In one or more examples, the first oxide region 536 and the second oxide region 540 can individually include one or more layers of silicon dioxide. In one or more illustrative examples, the second source connector 518 can optionally extend from the first source electrical contact 520 to the first barrier structure 538. In these scenarios, a first optional electrical contact 542 can be coupled to the extended portion of the first source electrical contact 520. In various examples, the extended portion of the second source connector 518 and the first optional electrical contact 542 can provide an additional barrier structure in situations where ions may move into the first oxide region 536. For example, in instances where a structural failure of the outer shell of the reservoir 502 occurs and/or a structural failure of a first gate structure occurs, ions stored in the reservoir 502 and/or ions located in the channel region 504 may move into the first oxide region 536. The extension of the second source connector 518 and the first optional electrical contact 542 can be configured to minimize or prevent the diffusion of ions into other portions of the semiconductor device 500 and, as a result, minimize any contamination that may occur in situations where ions may escape from the reservoir 502 and/or the first portion of the channel region 504.

The semiconductor device 500 can also include a third source connector 544 and a fourth source connector 546. In addition, the semiconductor device 500 can include a second source electrical contact 548. Further, the semiconductor device 500 can include components of second detection circuitry that can be used to indicate the presence or absence of at least a threshold amount of ions in the second portion of the channel region 504 that includes the third gate region 512 and the fourth gate region 514. The second detection circuitry can include a third additional connector 550, a fourth additional electrical contact 552 coupled to the third additional connector 550, and a fifth additional electrical contact 554 coupled to the third additional connector 550. The second detection circuitry can also include a fourth additional connector 556 and a sixth additional electrical contact 558 coupled to the fourth additional connector 556. In one or more examples, a third metal oxide region 560 can be disposed between the fourth source connector 546 and the third additional connector 550 and a fourth metal oxide region 562 can be disposed between the third additional connector 550 and the fourth additional connector 556. In various examples, the third metal oxide region 560 and the fourth metal oxide region 562 can comprise silicon dioxide.

The semiconductor device 500 can include a third oxide region 564 adjacent to the reservoir 502, a second barrier structure 566 disposed on the third oxide region 564, and a fourth oxide region 568 disposed on the second barrier structure 566. In one or more examples, the third oxide region 564 and the fourth oxide region 568 can individually include one or more layers of silicon dioxide. In one or more illustrative examples, the fourth source connector 546 can optionally extend from the second source electrical contact 548 to the second barrier structure 566. In these scenarios, a second optional electrical contact 570 can be coupled to the extended portion of the second source electrical contact 548. In various examples, the extended portion of the fourth source connector 546 and the second optional electrical contact 570 can provide an additional barrier structure in situations where ions may move into the third oxide region 564. For example, in instances where a structural failure of the outer shell of the reservoir 502 occurs and/or a structural failure of a first gate structure occurs, ions stored in the reservoir 502 and/or ions present in the channel region 504 may move into the third oxide region 564. The extension of the fourth source connector 546 and the second optional electrical contact 570 can be configured to minimize or prevent the diffusion of ions into other portions of the semiconductor device 500 and, as a result, minimize any contamination that may occur in situations where ions may escape from the reservoir 502 or the second portion of the channel region 504.

The silicon region 506 of the semiconductor device 500 can include a first n-type doped region 572. In one or more examples, the first n-type doped region 572 can include one or more sub-regions having a concentration of n-type dopants different from one or more other subregions of the first n-type doped region 572. The silicon region 506 can also include a first p-type doped region 574. The first p-type doped region 574 can be located within the first n-type doped region 572. Additionally, the silicon region 506 can include a second n-type doped region 576. The second n-type doped region 576 can be located adjacent to an expanded region of the channel region 504 that corresponds to a first MOS device of the semiconductor device 500. In at least some examples, the first p-type doped region 574 and at least one of the first n-type doped region 572 or the second n-type doped region 576 can comprise a first P-N junction of the semiconductor device 500. The first P-N junction can generate a first electric field that prevents or minimizes the diffusion of ions from the reservoir 502 into the first portion of the channel region 504.

In addition, the silicon region 506 can include a first source n-type doped region 578. The first source n-type doped region 578 can be located in the first p-type doped region 574. The first source n-type doped region 578 can also be directly coupled to the second source connector 518. The first source n-type doped region 578 can include a greater concentration of n-type dopants than at least portions of at least one of the first n-type doped region 572 or the second n-type doped region 576. In one or more illustrative examples, the first p-type doped region 574 and at least one of the second n-type doped region 576 or the first source n-type doped region 578 can comprise a second P-N junction of the semiconductor device 500. The second P-N junction can generate a second electric field having a magnitude less than the first electric field of the first P-N junction. In one or more examples, the silicon region 506 can include a second p-type doped region 580. The second p-type doped region 580 can be located in the first p-type doped region 574. Additionally, the second p-type doped region 580 can be coupled directly to the first additional connector 522. Further, the second additional connector 528 can be adjacent to a portion of the first n-type doped region 572.

The silicon region 506 can also include a third p-type doped region 582. The third p-type doped region 582 can be disposed in the first n-type doped region 572. In addition, the silicon region 506 can include a fourth n-type doped region 584. The fourth n-type doped region 584 can be located adjacent to an expanded region of the channel region 504 that corresponds to a second MOS device of the semiconductor device 500. In at least some examples, the third p-type doped region 582 and at least one of the first n-type doped region 572 or the fourth n-type doped region 584 can comprise a third P-N junction of the semiconductor device 500. The third P-N junction can generate a third electric field that prevents or minimizes the diffusion of ions from the reservoir 502 into the second portion of the channel region 504. In one or more illustrative examples, a magnitude of the third electric field can be the same as or similar to the magnitude of the first electric field.

In various examples, the silicon region 506 can include a second source n-type doped region 586. The second source n-type doped region 586 can be located in the third p-type doped region 582. The second source n-type doped region 586 can also be directly coupled to the fourth source connector 546. The second source n-type doped region 586 can include a greater concentration of n-type dopants than at least portions of at least one of the first n-type doped region 572 or the fourth n-type doped region 584. In one or more illustrative examples, the third p-type doped region 582 and at least one of the fourth n-type doped region 584 or the second source n-type doped region 586 can comprise a fourth P-N junction of the semiconductor device 500. The fourth P-N junction can generate a fourth electric field having a magnitude less than the third electric field of the third P-N junction. In at least some examples, a magnitude of the fourth electric field can be similar to or the same as a magnitude of the second electric field. In one or more examples, the silicon region 506 can include a fourth p-type doped region 588. The fourth p-type doped region 588 can be located in the third p-type doped region 582. Additionally, the fourth p-type doped region 588 can be coupled directly to the third additional connector 550. Further, the fourth additional connector 556 can be adjacent to a portion of the first n-type doped region 572.

Figure 6:
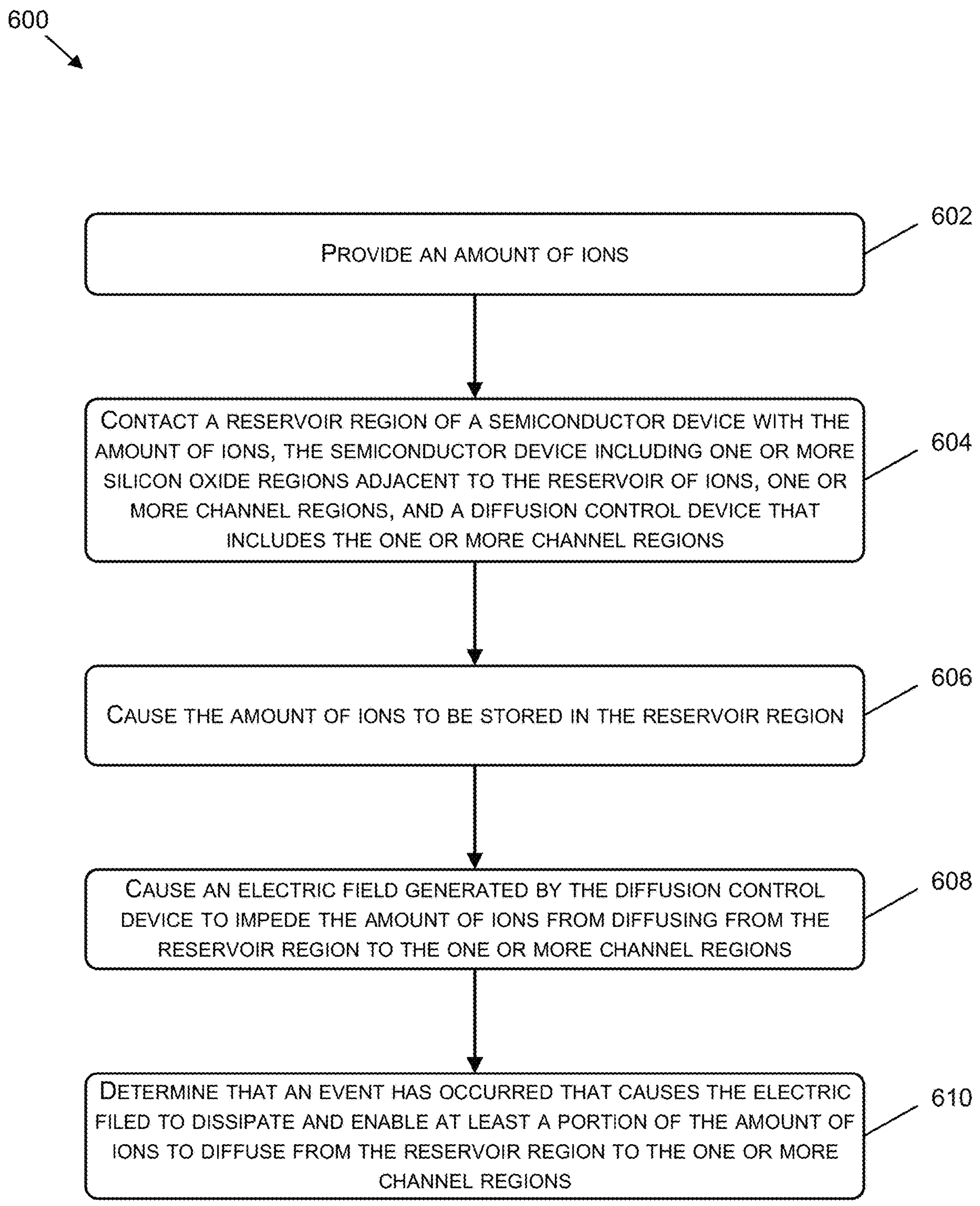
FIG. 6 is a diagram depicting a cross-section of at least a portion of an example semiconductor device including a reservoir of ions, one or more metal-oxide semiconductor devices to control diffusion of the ions out of the reservoir, and components configured to indicate diffusion of the ions out of the reservoir.

FIG. 6 is a flow diagram depicting operations of an example process 600 to form semiconductor devices having one or more ion diffusion control devices to control diffusion of ions from a reservoir into a channel region to indicate an environmental condition. the process 600 can include, at operation 602, providing an amount of ions. In one or more examples, the amount of ions can be provided in a solution. In various examples, the amount of ions can be provided in a salt solution. In at least some examples, the ions can include metal ions.

At operation 604, the process 600 can include contacting a reservoir region of a semiconductor device with the amount of ions. In various examples, the reservoir region of the semiconductor device can be contacted with the amount of ions by disposing an amount of a solution including the ions on at least the reservoir region of the semiconductor device. In one or more illustrative examples, the reservoir region can be contacted with a droplet that includes an amount of the ions. In scenarios where the semiconductor device includes a plurality of reservoir regions, individual droplets can be placed in contact with the individual reservoir regions. In one or more additional illustrative examples, the individual droplets can be produced by one or more printing devices.

In one or more examples, the semiconductor device can also include one or more silicon oxide regions adjacent to the reservoir of ions. In addition, the semiconductor device can include one or more channel regions. Further, the semiconductor device can include one or more diffusion control devices that include the one or more channel regions. The one or more diffusion control devices can control diffusion of the ions out of the reservoir and into the one or more channel region. In various examples, the semiconductor device can include a number of additional components, connectors, electrical contacts, and layers.

In one or more illustrative examples, at least a portion of the features of the semiconductor device can be produced using one or more additive processes that add material to at least one of one or more surfaces, one or more substrates, or one or more layers of the semiconductor device. Additionally, at least a portion of the features of the semiconductor device can be produced using a subtractive process where one or more layers of material of structures of the features of the semiconductor device are deposited onto at least one of one or more surfaces, one or more substrates, or one or more layers and portions of the material are removed according to an arrangement of features of the semiconductor device. In at least some illustrative examples, features of the semiconductor device can be manufactured using one or more lithography processes, such as optical lithography, electron beam lithography, direct write lithography, nanoprint lithography, one or more combinations thereof, and the like. In one or more additional illustrative examples, one or more deposition processes can be implemented to produce one or more features of the semiconductor device. To illustrate, one or more features of the semiconductor device can be manufactured using atmospheric pressure chemical vapor deposition (CVD), low-pressure CVD, ultrahigh vacuum CVD, aerosol assisted CVD, direct liquid injection CVD, microwave plasma-assisted CVD, plasma-enhanced CVD, remote plasma-enhanced CVD, atomic layer CVD (also known as ALD), combustion CVD, hot filament CVD, hybrid physical-chemical vapor deposition, metalorganic CVD, rapid thermal CVD, photo-initiated CVD, sputtering, electron beam evaporation, thermal evaporation, wet chemical processing, ion beam deposition, one or more combinations thereof, and so forth. In one or more further illustrative examples, one or more etching processes, such as one or more chemical etching processes, one or more wet etching processes, and/or one or more dry etching processes can be implemented to manufacture one or more features of the semiconductor device. In still other illustrative examples, one or more polishing operations, such as one or more chemical-mechanical polishing (CMP) operations can be performed to manufacture at least a portion of the features of the semiconductor device.

Additionally, the process 600, at operation 606 can include causing the amount of ions to be stored in the reservoir region. In at least some examples, the ions included in the solution can be moved from the solution into the reservoir by applying at least one of heat or pressure to the solution. In one or more illustrative examples, a laser can be used to cause the amount of ions to be moved from a solution including the ions to the reservoir region.

Further, at operation 608, the process 600 can include causing an electric field generated by the diffusion control device to impede the amount of ions from diffusion from the reservoir region to the one or more channel regions. In one or more examples, the electric field can be generated by one or more P-N junctions present in the semiconductor device.

The process 600 can also include, at operation 610, determining that an event has occurred that causes the electric field to dissipate and enable at least a portion of the amount of ions to diffuse from the reservoir region to the one or more channel regions. In one or more examples, the electric field can dissipate in response to being subjected to at least a threshold voltage. In various examples, the threshold voltage can be applied in response to one or more conditions being present in which the semiconductor device is located. The one or more conditions can include one or more temperature conditions, one or more pressure conditions, one or more time-based conditions, or one or more combinations thereof. In at least some examples, the applied voltage can be at least 0.2 V, at least 0.4, at least 0.5 V, at least 0.6 V, at least 0.7 V, at least 0.8 V, at least 1 V, at least 1.2 V, at least 1.5 V, at least 2 V, or at least 3 V.

Figure 7:
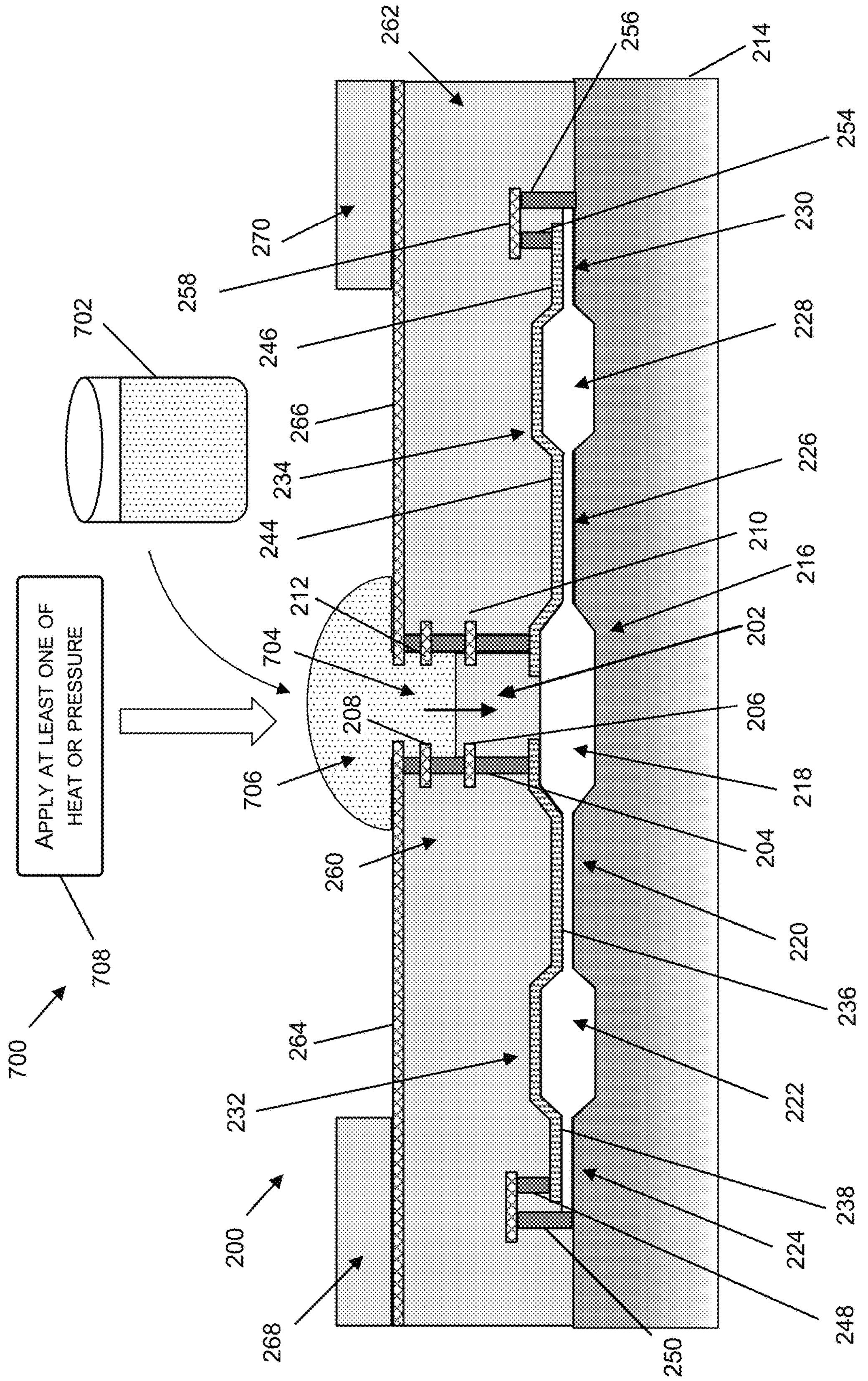
FIG. 7 is a flow diagram depicting operations of an example process to form semiconductor devices having one or more ion diffusion control devices to control diffusion of ions from a reservoir into a channel region to indicate an environmental condition.

FIG. 7 is a diagram depicting an example process 700 to produce a reservoir 202 of ions for a semiconductor device 200 including one or more metal-oxide semiconductor devices to control diffusion of ions out of the reservoir 202. The process 700 can include producing a solution 702 that includes an amount of ions. In one or more examples, the solution 702 can comprise an aqueous solution that includes a concentration of ions. In various examples, an amount of the solution 702 can be disposed on the semiconductor device 200. In at least some examples, an amount of the solution 702 can be placed on the first barrier structure 264 and the second barrier structure 266. The first barrier structure 264 and the second barrier structure 266 can prevent or minimize ions included in the solution 702 from diffusing into the first oxide region 260 and the second oxide region 262. Additionally, an amount of the solution 702 can be disposed in a cavity 704 formed by the outer shell 204 and above the reservoir 202. In one or more illustrative examples, a droplet 706 of the solution 702 can be disposed on the semiconductor device 200. In one or more additional illustrative examples, the droplet 706 can be placed on the semiconductor device 200 using a printing device.

At operation 708, at least one of heat or pressure can be applied to the droplet 706 to cause the ions to be located in the reservoir 202. In one or more illustrative examples, a laser can be applied to the droplet 706 to cause ions in the droplet 706 to be driven out of the droplet 706 and into the reservoir 202. In at least some examples, after operation 708 has been performed and ions included in the droplet 706 are placed in the reservoir 202, one or more rinsing or other cleaning processes can be applied to remove excess portions of the solution 702 from the semiconductor device 200.

A numbered non-limiting list of aspects of the present subject matter is presented below.

Aspect 1. A semiconductor device comprising: a reservoir of ions having an outer shell and an interior region, wherein the ions are disposed in the interior region and the outer shell is comprised of one or more metals; one or more silicon oxide regions disposed adjacent to the reservoir of ions; one or more channel regions disposed below the reservoir and below the one or more silicon oxide regions, the one or more channel regions comprising one or more metal oxide materials; and an ion diffusion control device coupled to the reservoir and including the one or more channel regions, wherein an electric field generated by the ion diffusion control device controls diffusion of the ions from the reservoir into the one or more channel regions.

Aspect 2. The semiconductor device of aspect 1, wherein the ion diffusion control device includes a metal-oxide semiconductor device, the metal-oxide semiconductor device including at least a portion of a channel region of the one or more channel regions and including a gate region, the gate region comprising one or more polysilicon materials.

Aspect 3. The semiconductor device of aspect 2, wherein the ion diffusion control device is a first diffusion control device that comprises a first portion of the channel region and a first portion of the gate region, and the semiconductor device comprises a second diffusion control device, the second diffusion control device comprising a second portion of the channel region and a second portion of the gate region.

Aspect 4. The semiconductor device of aspect 3, wherein at least one of the first portion of the gate region and the second portion of the gate region are coupled to a gate electrical contact and the channel region is coupled to a source electrical contact.

Aspect 5. The semiconductor device of aspect 4, wherein the channel region includes: a first expanded region located under the reservoir and having a first height; a second expanded region having a second height; a first constricted region coupling the first expanded region to the second expanded region and having a third height; and a second constricted region coupled to the second expanded region and having a fourth height; wherein the first height and the second height are greater than the third height and the fourth height.

Aspect 6. The semiconductor device of aspect 5, wherein: the first portion of the gate region is disposed over the first constricted region; the second portion of the gate region is disposed over the second constricted region; and a first length of the first constricted region is greater than a second length of the second constricted region.

Aspect 7. The semiconductor device of aspect 6, comprising a silicon layer disposed below one or more channel regions, the silicon layer having one or more p-type doped regions comprising an amount of one or more p-type dopants and one or more n-type doped regions comprising an amount of one or more n-type dopants.

Aspect 8. The semiconductor device of aspect 7, wherein the silicon layer includes a first n-type doped region of the one or more n-type doped regions disposed below the first expanded region and a second n-type doped region of the one or more n-type doped regions coupled to the source electrical contact.

Aspect 9. The semiconductor device of aspect 8, wherein the first n-type doped region has a first concentration of the one or more n-type dopants that is less than a second concentration of the one or more n-type dopants included in the second n-type doped region.

Aspect 10. The semiconductor device of aspect 8, wherein the silicon layer includes a p-type doped region of the one or more p-type doped regions disposed below the first constricted region, below the second expanded region, below the second constricted region, and below the second n-type doped region.

Aspect 11. The semiconductor device of aspect 10, wherein the silicon layer includes a third n-type doped region disposed below the first n-type doped region and the p-type doped region.

Aspect 12. The semiconductor device of any one of aspects claim 3-11, wherein a first electric field is present in the first diffusion control device and a second electric field is present in the second diffusion control device with the first electric field having a first magnitude that is greater than a second magnitude of the second electric field.

Aspect 13. The semiconductor device of aspect 12, wherein the first electric field and the second electric field are configured to dissipate when exposed to a voltage having at least a threshold value.

Aspect 14. The semiconductor device of aspect 13, wherein the voltage having at least the threshold value is produced in response to exposure to at least a threshold temperature.

Aspect 15. The semiconductor device of aspect 13 or 14, wherein the ions disposed in the reservoir move into the one or more channel regions in response to dissipation of the first electric field and the second electric field.

Aspect 16. The semiconductor device of aspect 15, comprising: detection circuitry at least partly disposed in the one or more silicon oxide regions and electrically coupled to the gate region, wherein applying an additional voltage to the detection circuitry indicates whether diffusion of the ions into the one or more channel regions has occurred.

Aspect 17. The semiconductor device of any one of aspects claim 1-16, wherein the ions comprise ions of one or more metals.

Aspect 18. The semiconductor device of aspect 17, wherein the one or more metals of the outer shell are different from the one or more metals of the ions.

Aspect 19. The semiconductor device of aspect 17 or 18, wherein the one or more metals of the ions comprise one or more positively charged alkali metal ions.

Aspect 20. A semiconductor device comprising: a reservoir of ions; and a plurality of metal-oxide semiconductor (MOS) devices to control diffusion of the ions from the reservoir into one or more channel regions of the plurality of MOS devices.

Aspect 21. The semiconductor device of aspect 20, wherein: the plurality of MOS devices includes a first gate region connected in series with a second gate region; a first electric field having a first magnitude is produced in relation to the first gate region; and a second electric field having a second magnitude is produced in relation to the second gate region, the second magnitude being less than the first magnitude.

Aspect 22. The semiconductor device of aspect 21, wherein plurality of MOS devices are configured such that a voltage applied to the first gate region having at least a threshold value causes the first electric field and the second electric field to dissipate and cause at least a portion of the ions to diffuse into the one or more channel regions.

Aspect 23. A process comprising: providing an amount of ions; contacting a reservoir region of a semiconductor device with the amount of ions such that the amount of ions are stored in the reservoir region, the semiconductor device comprising: one or more silicon oxide regions disposed adjacent to the reservoir region; one or more channel regions disposed below the reservoir region and below the one or more silicon oxide regions, the one or more channel regions comprising one or more metal oxide materials; and a diffusion control device coupled to the reservoir region and including the one or more channel regions, wherein an electric field generated by the diffusion control device controls diffusion of the ions from the reservoir region into the one or more channel regions.

Aspect 24. The process of aspect 23, comprising: providing a solution comprising the amount of ions; contacting the reservoir region with the solution; and causing the ions to be disposed in the reservoir region by applying heat to the solution and the reservoir region.

Aspect 25. The process of aspect 24, wherein contacting the reservoir region with the solution includes placing a droplet of the solution onto the reservoir region using a printing device.

Aspect 26. The process of aspect 24 or 25, wherein the heat is applied to the solution and to the reservoir region using a laser.

Aspect 27. The process of any one of aspects 24-26, comprising: applying a voltage to detection circuitry of the semiconductor device to determine whether the ions have moved from the reservoir region to the one or more channel regions.

Each of the non-limiting aspects or examples described herein may stand on its own or may be combined in various permutations or combinations with one or more of the other examples.

The above detailed description includes references to the accompanying drawings, which form a part of the detailed description. The drawings show, by way of illustration, specific embodiments in which the invention may be practiced. These implementations are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other implementations can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed implementation. Thus, the following claims are hereby incorporated into the Detailed Description as examples or implementations, with each claim standing on its own as a separate implementation, and it is contemplated that such implementations can be combined with each other in various combinations or permutations. The scope of the invention should be determined with reference to the appended claims, along with the full scope of equivalents to which such claims are entitled.

What is claimed is:

1. A semiconductor device comprising:
a reservoir of ions having an outer shell and an interior region, wherein the ions are disposed in the interior region and the outer shell is comprised of one or more metals;
one or more silicon oxide regions disposed adjacent to the reservoir of ions;
one or more channel regions disposed below the reservoir and below the one or more silicon oxide regions, the one or more channel regions comprising one or more metal oxide materials; and
an ion diffusion control device coupled to the reservoir and including the one or more channel regions, wherein an electric field generated by the ion diffusion control device controls diffusion of the ions from the reservoir into the one or more channel regions.

2. The semiconductor device of claim 1, wherein the ion diffusion control device includes a metal-oxide semiconductor device, the metal-oxide semiconductor device including at least a portion of a channel region of the one or more channel regions and including a gate region, the gate region comprising one or more polysilicon materials.

3. The semiconductor device of claim 2, wherein the ion diffusion control device is a first diffusion control device that comprises a first portion of the channel region and a first portion of the gate region, and the semiconductor device comprises a second diffusion control device, the second diffusion control device comprising a second portion of the channel region and a second portion of the gate region.

4. The semiconductor device of claim 3, wherein at least one of the first portion of the gate region and the second portion of the gate region are coupled to a gate electrical contact and the channel region is coupled to a source electrical contact.

5. The semiconductor device of claim 4, wherein the channel region includes:
a first expanded region located under the reservoir and having a first height;
a second expanded region having a second height;
a first constricted region coupling the first expanded region to the second expanded region and having a third height; and
a second constricted region coupled to the second expanded region and having a fourth height;
wherein the first height and the second height are greater than the third height and the fourth height.

6. The semiconductor device of claim 5, wherein:
the first portion of the gate region is disposed over the first constricted region;
the second portion of the gate region is disposed over the second constricted region; and
a first length of the first constricted region is greater than a second length of the second constricted region.

7. The semiconductor device of claim 6, comprising a silicon layer disposed below one or more channel regions, the silicon layer having one or more p-type doped regions comprising an amount of one or more p-type dopants and one or more n-type doped regions comprising an amount of one or more n-type dopants.

8. The semiconductor device of claim 7, wherein the silicon layer includes a first n-type doped region of the one or more n-type doped regions disposed below the first expanded region and a second n-type doped region of the one or more n-type doped regions coupled to the source electrical contact.

9. The semiconductor device of claim 8, wherein the first n-type doped region has a first concentration of the one or more n-type dopants that is less than a second concentration of the one or more n-type dopants included in the second n-type doped region.

10. The semiconductor device of claim 8, wherein the silicon layer includes a p-type doped region of the one or more p-type doped regions disposed below the first constricted region, below the second expanded region, below the second constricted region, and below the second n-type doped region.

11. The semiconductor device of claim 10, wherein the silicon layer includes a third n-type doped region disposed below the first n-type doped region and the p-type doped region.

12. The semiconductor device of claim 3, wherein a first electric field is present in the first diffusion control device and a second electric field is present in the second diffusion control device with the first electric field having a first magnitude that is greater than a second magnitude of the second electric field.

13. The semiconductor device of claim 12, wherein the first electric field and the second electric field are configured to dissipate when exposed to a voltage having at least a threshold value.

14. The semiconductor device of claim 13, wherein the voltage having at least the threshold value is produced in response to exposure to at least a threshold temperature.

15. The semiconductor device of claim 13, wherein the ions disposed in the reservoir move into the one or more channel regions in response to dissipation of the first electric field and the second electric field.

16. The semiconductor device of claim 15, comprising:
detection circuitry at least partly disposed in the one or more silicon oxide regions and electrically coupled to the gate region, wherein applying an additional voltage to the detection circuitry indicates whether diffusion of the ions into the one or more channel regions has occurred.

17. The semiconductor device of claim 1, wherein the ions comprise one or more positively charged alkali metal ions.

18. A semiconductor device comprising:
a reservoir of ions; and
a plurality of metal-oxide semiconductor (MOS) devices to control diffusion of the ions from the reservoir into one or more channel regions of the plurality of MOS devices.

19. The semiconductor device of claim 18, wherein:
the plurality of MOS devices includes a first gate region connected in series with a second gate region;
a first electric field having a first magnitude is produced in relation to the first gate region; and
a second electric field having a second magnitude is produced in relation to the second gate region, the second magnitude being less than the first magnitude.

20. A process comprising:
providing an amount of ions;
contacting a reservoir region of a semiconductor device with the amount of ions such that the amount of ions are stored in the reservoir region, the semiconductor device comprising:
one or more silicon oxide regions disposed adjacent to the reservoir region;
one or more channel regions disposed below the reservoir region and below the one or more silicon oxide regions, the one or more channel regions comprising one or more metal oxide materials; and a diffusion control device coupled to the reservoir region and including the one or more channel regions, wherein an electric field generated by the diffusion control device controls diffusion of the ions from the reservoir region into the one or more channel regions.

* * * * *